United States Patent [19]

Shimizu et al.

[11] Patent Number: 4,796,067
[45] Date of Patent: Jan. 3, 1989

[54] SEMICONDUCTOR DEVICE HAVING A SUPERLATTICE STRUCTURE

[75] Inventors: Akira Shimizu; Toshitami Hara, both of Tokyo; Hidetoshi Nojiri, Matsudo; Isao Hakamada, Yokohama; Seiichi Miyazawa; Yoshinobu Sekiguchi, both of Kawasaki, all of Japan

[73] Assignee: Canon Kabushiki Kaisha, Tokyo, Japan

[21] Appl. No.: 828,254

[22] Filed: Feb. 11, 1986

[30] Foreign Application Priority Data

Feb. 19, 1985 [JP] Japan ................................ 60-29305

[51] Int. Cl.$^4$ ...................... H01L 27/12; H01L 33/00
[52] U.S. Cl. ............................ 357/4; 357/16; 357/17; 357/23.7; 357/23.2
[58] Field of Search ............... 357/4 SL, 16, 17, 23.7, 357/23.2

[56] References Cited

U.S. PATENT DOCUMENTS

| | | | |
|---|---|---|---|
| 4,525,687 | 6/1985 | Chemla | 357/4 SL |
| 4,528,464 | 7/1985 | Chemla | 357/4 SL |
| 4,644,553 | 2/1987 | Van Ruyven | 357/4 SL |

Primary Examiner—Martin H. Edlow
Attorney, Agent, or Firm—Fitzpatrick, Cella, Harper & Scinto

[57] ABSTRACT

A semiconductor device having a plurality of laminated semiconductor layers in which a current flows in the direction of lamination. A superlattice layer is formed in at least one of the layers and the potential of the quantum well of the superlattice layer is lower than the potential of the semiconductor layer in which the superlattice layer is formed. The potential of the barrier of the superlattice layer is higher than the potential of the semiconductor layer in which said superlattice layer is formed.

5 Claims, 2 Drawing Sheets

4,796,067

SEMICONDUCTOR DEVICE HAVING A SUPERLATTICE STRUCTURE

BACKGROUND OF THE INVENTION

1. Field of the Invention

The present invention relates to a semiconductor device having a superlattice structure.

2. Description of the Related Technology

Semiconductor divices have been developed which are formed by laminating semiconductor layers. In these devices, superlattice buffer layers are inserted between the layers or in the layers in order to improve a quality of the heterojunction interfaces of the layers to fabricate a semiconductor device having excellent performance characteristics.

FIG. 1 shows a layer structure of a prior art semiconductor device in which superlattice buffer layers 7 and 8 are formed in a heterojunction bipolar transistor. In this semiconductor device, a substrate 1, an electrode forming layer 2, a collector layer 3, a base layer 4, an emitter layer 5, an electrode forming layer 6 and superlattice buffer layers 7 and 8 are provided to improve a quality of the heterojunction interfaces. In this layer structure, the potential period of the superlattice structure of the superlattice buffer layers 7 and 8 is decreased closer to the base layer 4 to create a tapered junction effect by which the potential changes in an inclined manner so that a decrease of the current gain due to an electron trap in a notch of an energy band which occurs in a stepped junction (in which the potential changes stepwise) is prevented.

In a prior art semiconductor laser device shown in FIG. 2, an n-GaAs electrode forming layer 22 is formed on a substrate 21, and an n-Al$_x$Ga$_{1-x}$As clad layer 23, a GaAs activation layer 24, a p-Al$_x$Ga$_{1-x}$As clad layer 25 and a p-GaAs electrode forming layer 26 are formed thereon, and a superlattice buffer layer is formed between the clad layer 23 and the activation layer 24 in order to improve the quality of the activation layer as is done in FIG. 1 and to allow a low current drive.

In such structures, electrons fall into a low energy level in the buffer layers 7 and 8 or electrons are reflected by the buffer layers 7 and 8 and a voltage drop occurs in the buffer layer. As a result, an extra voltage must be applied to the device.

SUMMARY OF THE INVENTION

It is an object of the present invention to provide a semiconductor device having a superlattice buffer layer, a collector layer (one clad layer) and an emitter layer (another clad layer), in which the voltage drop across the superlattice buffer layer is reduced to allow effective utilization of an externally applied voltage.

Specifically, the semiconductor device of the present invention is characterized in that the superlattice buffer layer (a potential at a quantum well is V$_W$, a potential at a barrier is V$_B$) is formed in at least one semiconductor layer (a potential thereof is V$_0$), with the potential relationship of V$_W$<V$_0$<V$_B$.

In accordance with another feature of the present invention, a semiconductor device is provided having a semiconductor laser structure including clad layers (potential thereof is V$_0$) which sandwich an activation layer. A superlattice buffer layer (a potential of a quantum well is V$_W$, and a potential of a barrier is V$_B$) is formed in at least one of the clad layers, with a potential relationship of V$_W$<V$_0$<V$_B$.

DESCRIPTION OF THE PREFERRED EMBODIMENTS

Figure 3:
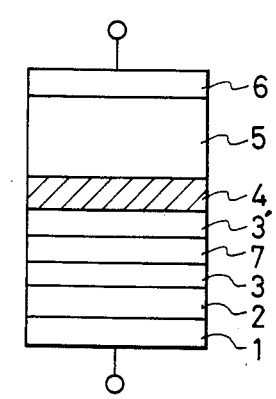
FIG. 3 shows a layer structure of one embodiment of the present invention.

FIG. 3 shows a layer structure of a heterojunction bipolar transistor in accordance with a first embodiment of the present invention.

In the present embodiment, an n$^+$-GaAs layer 2 is epitaxially grown on a GaAs substrate 1 to a thickness of approximately 0.5 μm, then an n-Al$_x$Ga$_{1-x}$As collector layer 3 is grown to a thickness of approximately 0.2 μm. Then, a superlattice buffer layer 7 having N periods for n-GaAs (L$_W$ Å)/n-AlYGa$_{1-Y}$As(L$_B$Å) is grown and then collector layer 3' is again grown to a thickness of approximately 0.2 μm. A p-GaAs base layer 4 is grown thereon to a thickness of approximately 0.2 μm, an n-Al$_x$Ga$_{1-x}$As emitter layer 5 is grown to approximately 0.4 μm, and finally an n$^+$-GaAs electrode forming layer 6 is grown to approximately 0.1 μm. In the above, x and Y represent the mole fraction of Al and Ga of the collectors 3 and 3' and the mole fraction of Al and Ga in the barrier of the superlattice buffer layer 7, and L$_W$ and L$_B$ represent widths of the quantum well and the barrier of the superlattice structure of the superlattice buffer layer 7.

Figure 4:
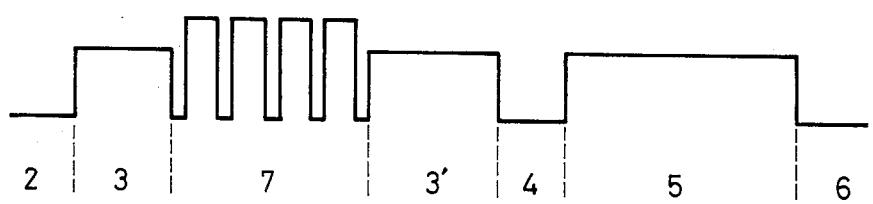
FIG. 4 shows an energy band for the embodiment of FIG. 3.

FIG. 4 shows an energy band of a conduction band in the structure of the embodiment of FIG. 3. Electrons injected from the emitter layer 5 pass through the base layer 4 and reach the collector layer 3' and tend to flow into the collector layer 3 through the superlattice buffer layer 7. Because of the presence of the superlattice layer 7, there exist the following two problems.

(i) Electrons fall into a lower energy level than that of the collector layer 3' in the superlattice buffer layer 7.

(ii) A large voltage drop occurs in the superlattice buffer layer 7 by reflection of the electrons at a boundary of the collector layer 3' and the superlattice buffer layer 7.

In the present invention, in order to solve the problem (i), the mole fractions are selected to satisfy Y>x, and the width L$_W$ of the quantum well is selected to several tens Å. Potentials of the collector layers 3 and 3' are approximately 100.x meV and a potential of the barrier (Al$_x$Ga$_{1-x}$As area) in the superlattice buffer layer 7 is approximately 100.x meV. Accordingly, in order to satisfy Y>x, the potential of the barrier of the superlattice buffer layer 7 is selected to be higher than the potentials of the collector layers 3 and 3'. Thus, the normal energy level of the superlattice system of the superlattice buffer layer 7 is prevented from becoming lower than the potential of the collector layer 3. Specifically, a potential difference 100.Y meV−100.x meV is selected to be several tens to several hundreds meV, and the width $L_W$ of the quantum well is selected to be several tens Å.

In order to overcome problem (ii), the band width of a normal sub-band of the superlattice system of the superlattice buffer layer 7 is selected to be wider than several tens meV. To this end, the width $L_B$ of the quantum well is selected to be several tens Å to several hundreds Å. In order to design detail of the parameters x, Y, $L_W$ and $L_B$, the Kronig-Penney model may be used to calculate a sub-band structure of the superlattice system. Accordingly, the conditions to be met to overcome the problems (i) and (ii) are: (A) the normal energy level of the superlattice system is substantially equal to the potentials of the collector layers on both sides, and (B) the band width of the normal sub-band of the superlattice system is selected to be wide enough to allow the electrons entering from one of the collector layers 3 to readily pass through the superlattice buffer layer 7 and reach the opposite collector layer 3.

The period of the actual superlattice buffer layer 7 does not continue indefinitely as opposed to the Kronig-Penney model, but several periods are sufficient to obtain a satisfactory result in the calculation described above.

As one example, x=0.27, Y=0.5, $L_W$=20 Å and $L_B$=50 Å are selected. The normal energy level of the superlattice system is at +273 meV from the bottom of the conduction band of GaAs. Because it is substantially equal to the potentials of the collector layers 3 and 3', problem (i) is resolved. In the superlattice system, the normal sub-band is formed in a range of 273 meV–301 meV. Thus, the reflection factor of the electrons entering from the collector layer 3' in this energy range is very low, and problem (ii) is resolved. In actuality, the reflection factor for the buffer layer having N=4 periods as shown in FIG. 4 was calculated. It exhibits a periodic change such that the reflection factor is almost zero at 277, 286 and 296 meV. The semiconductor device which uses the parameters thus determined exhibits the excellent characteristics of a low voltage—low current operation.

Figure 5:
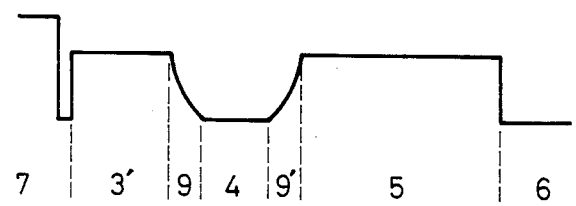
FIG. 5 shows an energy band when the vicinity of a base layer in FIG. 4 is of tapered junction structure.

FIG. 5 is a partial enlarged energy band chart of the conduction band for the structure of FIG. 3. As shown, $Al_{x'}Ga_{1-x'}As$ ($0 \leq x' \leq x$) tapered junction layers 9 and 9' are formed around the base 4 as shown in FIG. 5. Even in this case, the design of the superlattice buffer layer described hereinbelow is equally applicable.

The condition (B) primarily relates to a case where the electrons pass through the normal sub-band. A similar effect may be attained when the electrons pass through other sub-band. Accordingly, in order to overcome the problems noted above at least one sub-band having a width of several tens meV is within several tens meV above the potential of the clad 3'.

Even if the semiconductor material used for the superlattice buffer layer is different from those of the clad layer and the activation layer, the same design may be applicable as to the voltage drop. In this case, the potential of the well may be selected to be lower than the potential of the clad layer and higher than the potential of the activation layer in order to obtain a more efficient structure.

Figure 6:
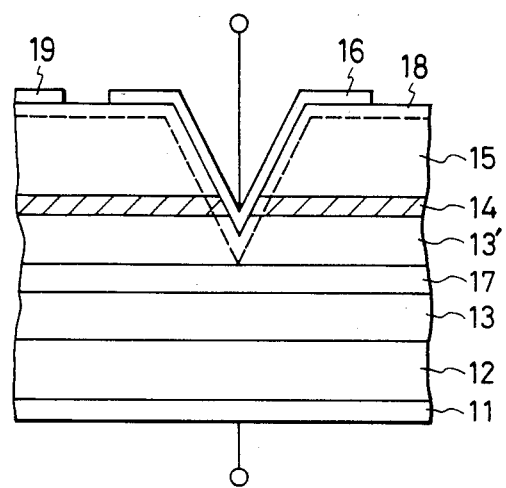
FIGS. 6, 7 and 10 show layer structures of other embodiments.

FIG. 6 shows a layer structure of a second embodiment. It is a GaAs/AlGaAs vertical mode mesa field effect transistor. An n-$Al_xGa_{1-x}As$ drain layer 13 is epitaxially grown to a thickness of approximately 1.5 μm on an n$^+$-GaAs substrate 12, then an n-GaAs/n-$Al_xGa_{1-x}As$ superlattice buffer layer 17 is grown, and an n-$Al_xGa_{1-x}As$ drain layer 13' is again grown to approximately 1.5 μm. Then, a p-GaAs gate layer 14 and an n-$Al_xGa_{1-x}As$ source layer 15 are grown in sequence, a groove of approximately 2.5 μm is etched, and silicon is ion-implanted to form a layer 18. Then, an Al gate electrode 16, an AuGe/Au drain electrode 11 and a source electrode 19 are formed. In the present structure, the superlattice buffer layer 17 is formed to improve the quality of a heterojunction interface between the drain layer 13 and the gate layer 14. The mole fractions x and Y and the parameters of the superlattice may be designed in the same manner as the previous embodiment for the heterojunction bipolar transistor. For example, x=0.27, Y=0.5, $L_W$=20 Å, $L_B$=50 Å and N=4 periods were selected and a satisfactory result was obtained.

Figure 7:
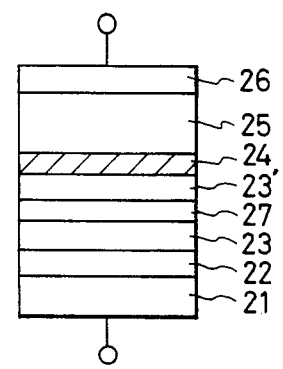

FIG. 7 shows a layer structure of a semiconductor device in accordance with a third embodiment of the present invention.

The present embodiment is a GaAs/AlGaAs semiconductor laser device. An n-GaAs electrode forming layer 22 is epitaxially grown on a GaAs substrate 21, and an n-$Al_xGa_{1-x}As$ clad layer 23 is grown to approximately 0.5 μm. Then, a superlattice layer 27 having N periods for n-GaAs ($L_W$ Å)/n-$AlYGa_{1-Y}As$ ($L_B$ Å) is grown, and an n-$Al_xGa_{1-x}As$ clad 23' is again grown to approximately 0.5 μm. A GaAs activation layer 24 is grown thereon to approximately 0.1 μm, a p-$Al_xGa_{1-x}As$ clad layer 25 is grown to approximately 1 μm and finally a p-GaAs electrode forming layer 26 is grown. The parameters were selected such that x=0.27, Y=0.5, $L_W$=20 Å, $L_B$=50 Å and N=4 periods, and a satisfactory result was obtained.

Figure 1:
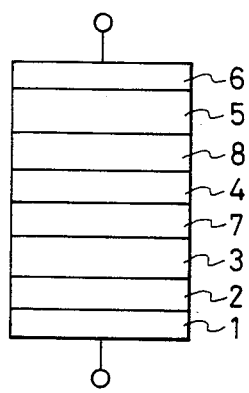
FIGS. 1 and 2 show layer structures of prior art semiconductor devices.
Figure 2:
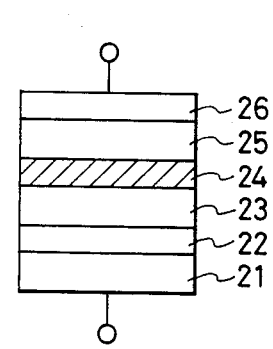
Figure 8:
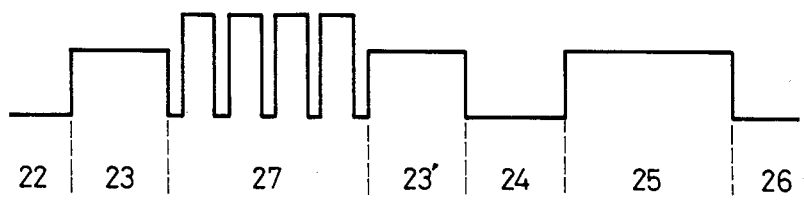
FIGS. 8 and 9 show conduction band energy bands of the other embodiments.

FIG. 8 shows a partial energy band chart of the conduction band for the structure of FIG. 7. The causes of the voltage drop across the superlattice buffer layer 27 and the conditions to eliminate the causes are same as those for the first embodiment (FIG. 2).

Figure 9:
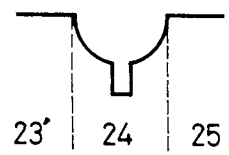

FIG. 9 is a partial enlarged energy band chart of the conduction band of the third embodiment shown in FIG. 8. The vicinity of the activation layer 24 may be of a tapered junction structure as is the case in the first embodiment (FIG. 3).

Figure 10:
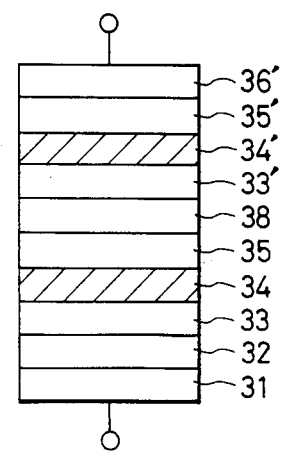

FIG. 10 shows a sectional view of a fourth embodiment of the present invention.

The present embodiment is a plane light emission laser device which emits a light normal to planes of activation layers 34 and 34'. Epitaxially formed in sequence on a GaAs substrate 31 are an n-GaAs electrode layer 32, an n-$Al_xGa_{1-x}As$ clad layer 33, a GaAs activation layer 34, a p-$Al_xGa_{1-x}As$ clad 35, a $p^{30}$-$Al_xGa_{1-x}As$ layer 38, an n-$Al_xGa_{1-x}As$ clad layer 33', a GaAs activation layer 34', a p-$Al_xGa_{1-x}As$ clad layer 35' and a p-GaAs electrode layer 36'. A superlattice buffer layer may be formed in at least one of the clad layers 33, 33', 35, 35' and the p$^+$-$Al_xGa_{1-x}As$ layer 38 in the same manner as FIG. 7 to improve the quality of the activation layers 34 and 34'. In accordance with the teaching of the present invention, the voltage drop is also avoided. In the plane light emission laser the plurality of activation layers 34 and 34' may be stacked. In such a case, the present invention is particularly effective because the applied voltage increases in proportion to the number of activation layers.

Many other modifications of the present invention may be implemented.

In the embodiment of FIG. 3, the superlattice buffer layer is formed between the n-$Al_xGa_{1-x}As$ collector layers, although it may be formed in other layer such as the emitter layer.

The present invention is more effective when a plurality of superlattice buffer layers are provided. In this case, the design of the respective superlattice buffer layers is same as that described above.

By changing the mole fraction Y, the width $L_B$ of the barrier and the width $L_W$ of the quantum well in the superlattice buffer layer, a more efficient structure can be attained.

The present invention is also effectively applied to a semiconductor device which used material other than GaAs/AlGaAs such as GaAs/AlGaInP.

In the above embodiments, the heterojunction bipolar transistor and the semiconductor laser were described, but the present invention is not limited thereto it can be applied to any semiconductor device having laminated semiconductor layers in which a current flows in a direction to penetrate the layers.

In accordance with the present invention, the semiconductor device having a satisfactory characteristic is provided under the non-severe condition that at least one sub-band of the superlattice buffer layer is included within several tens meV above the potential of the clad layer.

As described hereinabove, where the superlattice buffer layer (potentials to electrons or holes are $V_W$ at the quantum well and $V_B$ at the barrier) is inserted between the clad layers having the potential $V_0$, the potentials are selected to satisfy $V_W < V_0 < V_B$, and the parameters are appropriately selected to significantly reduce the voltage drop across the superlattice buffer layer.

As a result, the superlattice buffer layer may be formed at any position in the clad layer without a voltage drop and the quality of the activation layer is improved, thereby providing a laser device which operates on low current and a low voltage. Since the buffer layer may be formed at any position, the freedom of design of laser increases. The present invention is particularly effective for a plane light emission laser.

Where the superlattice buffer layer is to be formed close to the activation layer, the conditions are: (A) the normal energy level of the superlattice system is substantially equal to the potentials of the clads on both sides, and (B) the band width of the normal sub-band of the lattice system is wide enough to allow the electrons entering from one of the clad layers to easily pass through the superlattice buffer layer and reach the opposite clad layer. Thus, the voltage drop is reduced and the leakage of the electrons from the activation layer to the buffer layer can be suppressed.

We claim:

1. A semiconductor device comprising a plurality of laminated semiconductor layers adapted to receive a current flowing in the direction of lamination, and a semiconductor superlattice layer formed in at least one of said layers, wherein the potential of a quantum well of said superlattice layer is lower than the potential of the semiconductor layer in which said superlattice layer is formed, and the potential of a barrier of said superlattice layer is higher than the potential of the semiconductor layer in which said superlattice layer is formed.

2. A semiconductor device according to claim 1, wherein said semiconductor device is a semiconductor laser comprising a substrate, a laser active layer and clad layers sandwiching said active layer formed on a substrate, said clad layers having a higher potential than said active layer, and wherein said superlattice layer is formed in said clad layers.

3. A semiconductor device according to claim 2, wherein the normal energy level of the superlattice layer is substantially equal to the potential in the clad layers in which the superlattice layer is formed and wherein the width of the normal sub band in the superlattice layer is sufficiently wide for an electron incident from one clad layer to easily pass through the superlattice layer to reach the other clad layer.

4. A semiconductor device according to claim 1, wherein said semiconductor device is a transistor comprising a substrate, a collector layer formed on said substrate and in which said superlattice layer is formed, a base layer, and an emitter layer.

5. A semiconductor device according to claim 1, wherein said semiconductor device is a field effect transistor comprising a substrate, a drain layer in which said superlattice layer is formed, a gate layer, and a source layer.

* * * * *